United States Patent
Chen et al.

(10) Patent No.: US 8,278,184 B1
(45) Date of Patent: Oct. 2, 2012

(54) FABRICATION METHOD OF A NON-PLANAR TRANSISTOR

(75) Inventors: Ying-Tsung Chen, Kaohsiung (TW); Chien-Ting Lin, Hsinchu (TW); Shih-Hung Tsai, Tainan (TW); Ssu-I Fu, Kaohsiung (TW); Wen-Tai Chiang, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/287,131

(22) Filed: Nov. 2, 2011

(51) Int. Cl.
*H01L 21/76* (2006.01)

(52) U.S. Cl. .......... 438/433; 438/427; 438/432; 257/519

(58) Field of Classification Search .......... 438/433, 438/427, 432, 438, 514, 522, 526, 530, 706, 438/734, 735, 924; 257/197, 327, 328, 347, 257/353, 369, 412, 618
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,525,403 B2 * | 2/2003 | Inaba et al. | 257/618 |
| 6,921,963 B2 | 7/2005 | Krivokapic | |
| 7,087,477 B2 | 8/2006 | Fried | |
| 7,091,551 B1 | 8/2006 | Anderson | |
| 7,122,871 B2 * | 10/2006 | Lee et al. | 257/412 |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,531,437 B2 | 5/2009 | Brask | |
| 7,569,857 B2 | 8/2009 | Simon | |
| 8,039,843 B2 * | 10/2011 | Inaba | 257/64 |
| 8,148,217 B2 * | 4/2012 | Izumida et al. | 438/157 |
| 8,193,588 B2 * | 6/2012 | Chung | 257/347 |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0108528 A1 | 5/2007 | Anderson | |
| 2007/0158756 A1 | 7/2007 | Dreeskornfeld | |
| 2008/0157208 A1 | 7/2008 | Fischer | |
| 2008/0265338 A1 | 10/2008 | Yu | |
| 2009/0124097 A1 | 5/2009 | Cheng | |
| 2009/0242964 A1 | 10/2009 | Akil | |
| 2009/0269916 A1 | 10/2009 | Kang | |
| 2009/0278196 A1 * | 11/2009 | Chang et al. | 257/328 |
| 2010/0048027 A1 | 2/2010 | Cheng | |
| 2010/0072553 A1 | 3/2010 | Xu | |
| 2010/0144121 A1 | 6/2010 | Chang | |
| 2010/0163971 A1 * | 7/2010 | Hung et al. | 257/327 |
| 2010/0167506 A1 | 7/2010 | Lin | |

* cited by examiner

*Primary Examiner* — Victor A Mandala
*Assistant Examiner* — Errol Fernandes
(74) *Attorney, Agent, or Firm* — Winston Hsu; Scott Margo

(57) ABSTRACT

A method of forming a non-planar transistor is provided. A substrate is provided. The substrate has a plurality of isolation regions to be formed and a plurality of fin regions to be formed. A first etching process is performed to form a plurality of first trenches having a first depth in the substrate within the isolation regions. At least a doping region is formed in the substrate within the fin regions. A second etching process is performed to deepen the first depth to a second depth and a plurality of fin structures are formed in the substrate within the fin regions. Lastly, a gate is formed on the fin structures.

10 Claims, 6 Drawing Sheets

FABRICATION METHOD OF A NON-PLANAR TRANSISTOR

BACKGROUND OF THE INVENTION

1. Field of the Invention

The present invention relates to a fabrication method of a non-planar transistor, and more particularly, to a fabrication method of a non-planar transistor having a fin structure with an anti-punch-through doping region.

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demands of products.

However, with the increasing miniaturization of electronic products, current planar FETs no longer meet the requirements of the products. Thus, non-planar FETs such as Fin-shaped FETs (Fin-FET) have been developed, which includes a three-dimensional channel structure. The manufacturing processes of Fin-FET devices can be integrated into traditional logic device processes, and thus are more compatible. In addition, since the three-dimensional structure of the Fin-FET increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased. In current years, the development of the Fin-FETS is still aiming to devices with smaller scales.

SUMMARY OF THE INVENTION

The present invention therefore provides a fabrication method of a non-planar transistor, which can obtain a non-planar transistor having a fin structure with an anti-punch through doping region. Consequently, the quality of the devices can be improved.

According to the claimed invention, a fabrication method of a non-planar transistor is provided. A substrate is provided. The substrate has a plurality of isolation regions to be formed and a plurality of fin regions to be formed. A first etching process is performed to form a plurality of first trenches having a first depth in the substrate within the isolation regions. At least a doping region is formed in the substrate within the fin regions. A second etching process is performed to deepen the first depth to a second depth and a plurality of fin structures are formed in the substrate within the fin regions. Lastly, a gate is formed on the fin structures.

Since the bottom doping regions are formed directly in the silicon substrate in the isolation regions, the dopant in the bottom doping regions can diffuse into the fin regions more easily during the annealing process. The anti-punch-through doping regions can therefore be formed in the fin structures, avoiding the problem of leakage current and enhancing the quality of the non-planar transistors.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be made in detail. The preferred embodiments of the present invention are illustrated in the accompanying drawings with numbered elements.

Figure 1:
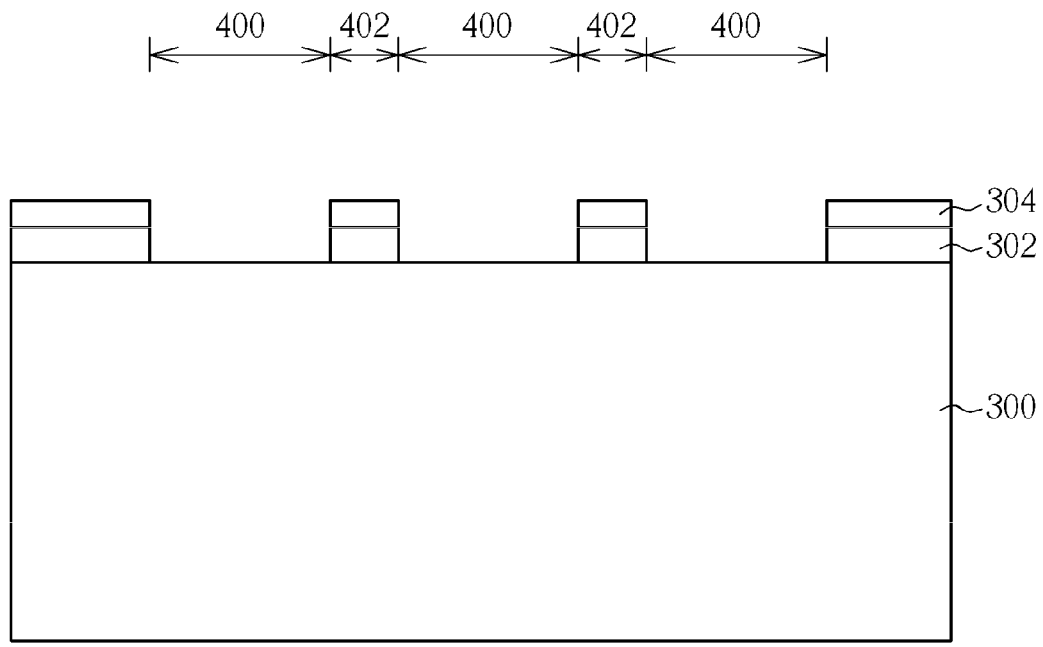
FIG. 1 to FIG. 9 illustrate schematic diagrams of the fabrication method of a non-planar FET according to the first embodiment in the present invention.

Please refer to FIG. 1 to FIG. 9, illustrating schematic diagrams of the fabrication method of a non-planar FET according to the first embodiment in the present invention. As shown in FIG. 1, a substrate 300, an optional pad layer 302 and a mask layer 304 are provided. By using a lithography process and an etching process, the pad layer 302 and the mask layer 304 are patterned, thereby defining a plurality of isolation regions 400 and a plurality of fin regions 402. Each isolation region 400 and each fin regions 402 are arranged alternatively with each other. In the subsequent steps, a shallow trench isolation will be formed in the isolation region 400 and a fin structure of a non-planar transistor will be formed in the fin region 402. The patterned pad layer 302 and the patterned mask layer 304 expose the substrate 300 in the isolation regions 400. In one embodiment, the substrate 300 may include a silicon substrate, an epitaxial silicon substrate, a silicon germanium substrate, a silicon carbide substrate or a silicon-on-insulator (SOI) substrate, but is not limited thereto. In one preferred embodiment of the present invention, the substrate 300 is a bulk silicon substrate. The pad layer 302 includes $SiO_2$, and the mask layer 304 includes materials that are suitable for a hard mask such as SiN, SiON, SiC or advanced pattern film (APF) provided by Applied Materials, or the combinations thereof, or the combinations of other materials. The mask layer 304 has a thickness ranging from 400 angstroms (A) to 1200 A, preferably 900 A. The pad layer 302 has a thickness ranging from 40 A to 120 A, preferably 110 A.

Figure 2:
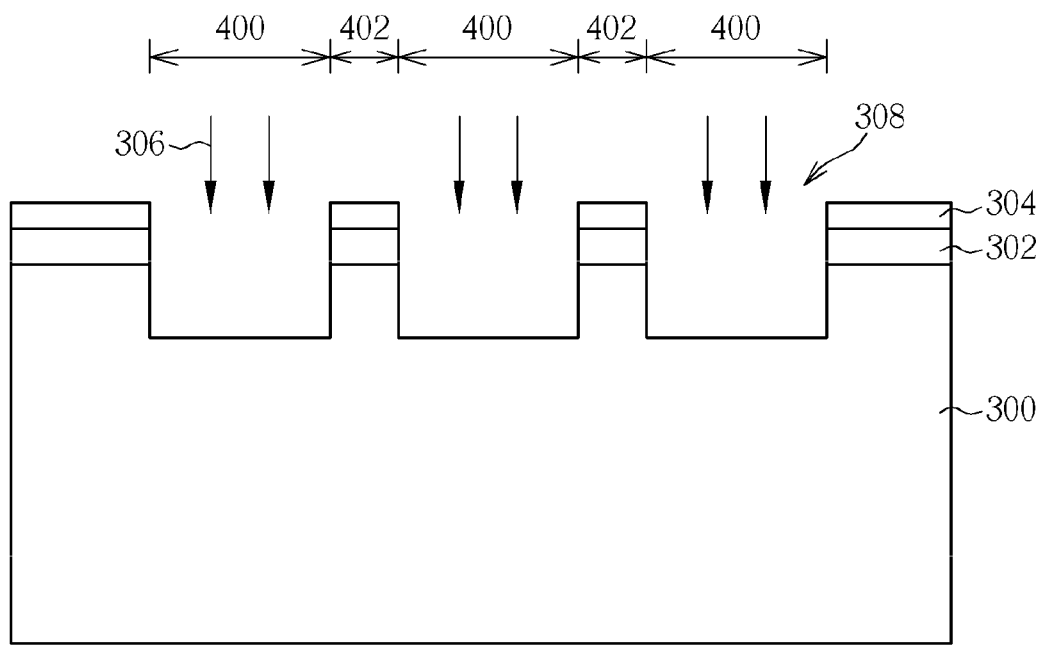

As shown in FIG. 2, a first etching process 306 is performed by using the patterned pad layer 302 and the patterned mask layer 304 as a mask to form a plurality of first trenches 308 in the substrate 300 in the isolation regions 400. The first trenches 308 are substantially parallel to each other. In one embodiment, the first trench 308 includes a first predetermined depth which is substantially between 200 A and 400 A. The first trench 308 exposes the substrate 300, and preferably, the exposed region of the substrate 300 includes silicon.

Figure 3:
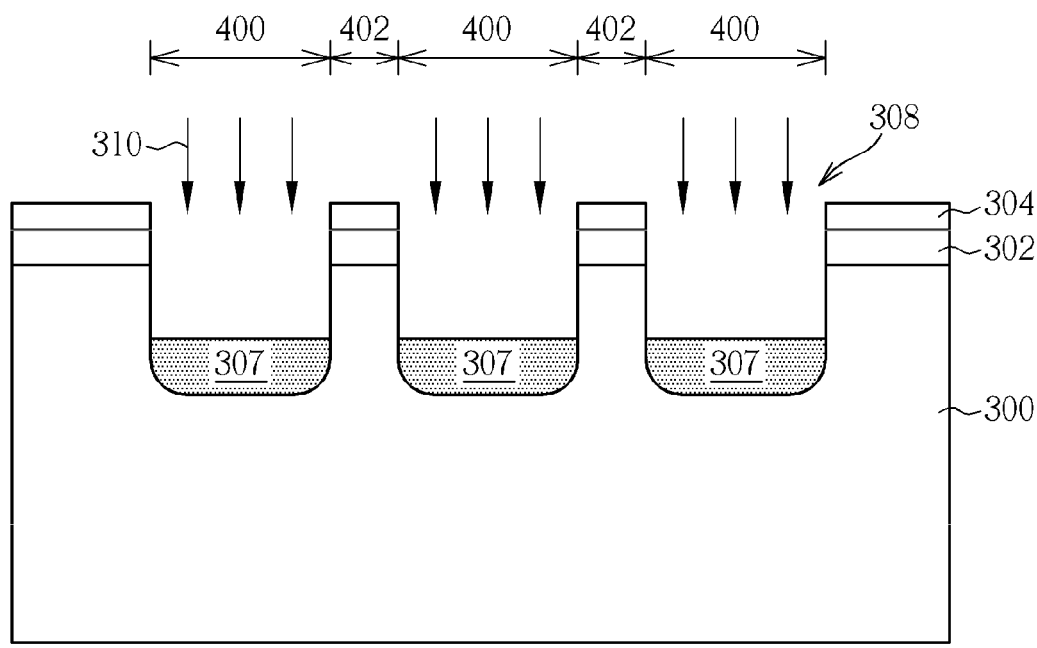
Figure 4:
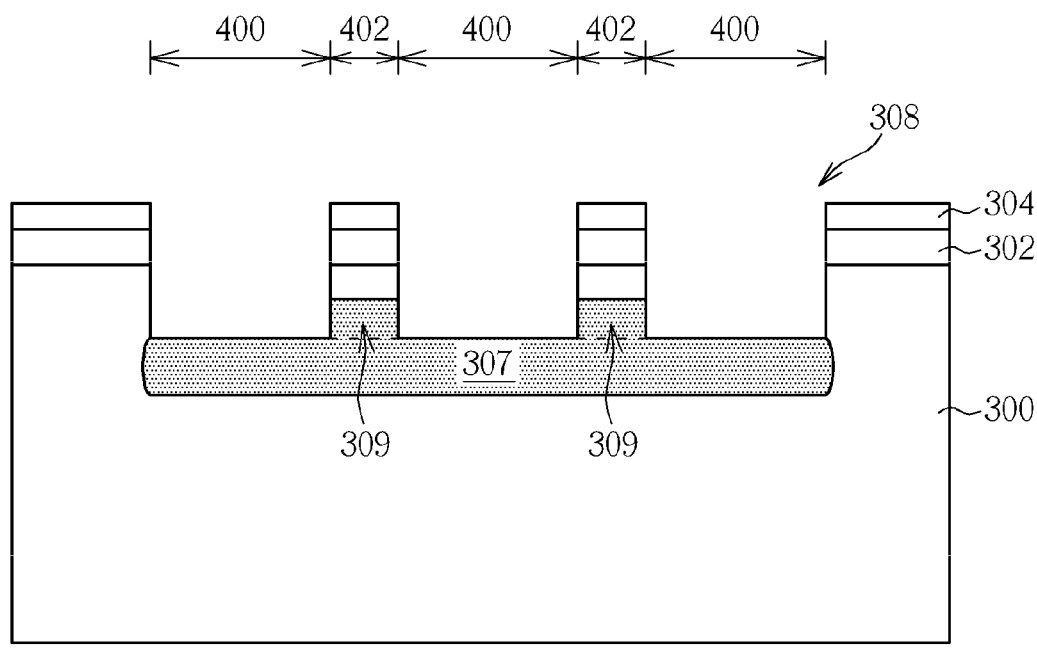

As shown in FIG. 3, a vertical implant process 310 is performed by using the patterned pad layer 302 and the patterned mask layer 304 as a mask to directly form a plurality of bottom doping regions 307 in the exposed substrate 300 in the isolation regions 400. Subsequently, as shown in FIG. 4, an annealing process is performed such that the dopant in the bottom doping region 307 can diffuse horizontally into the substrate 300 in the fin regions 402 to form a plurality of doping regions 309 therein. Because the bottom doping regions 307 are formed in the substrate 300 which contains silicon, which provides better diffusion ability in comparison with other materials such $SiO_2$, the dopant in the bottom doping region 307 can therefore diffuse more easily from the isolation regions 400 to the fin regions 402 to form the doping regions 309. In one preferred embodiment, the temperature of the annealing process is substantially between 500 to 1000 Celsius degrees.

Figure 5:
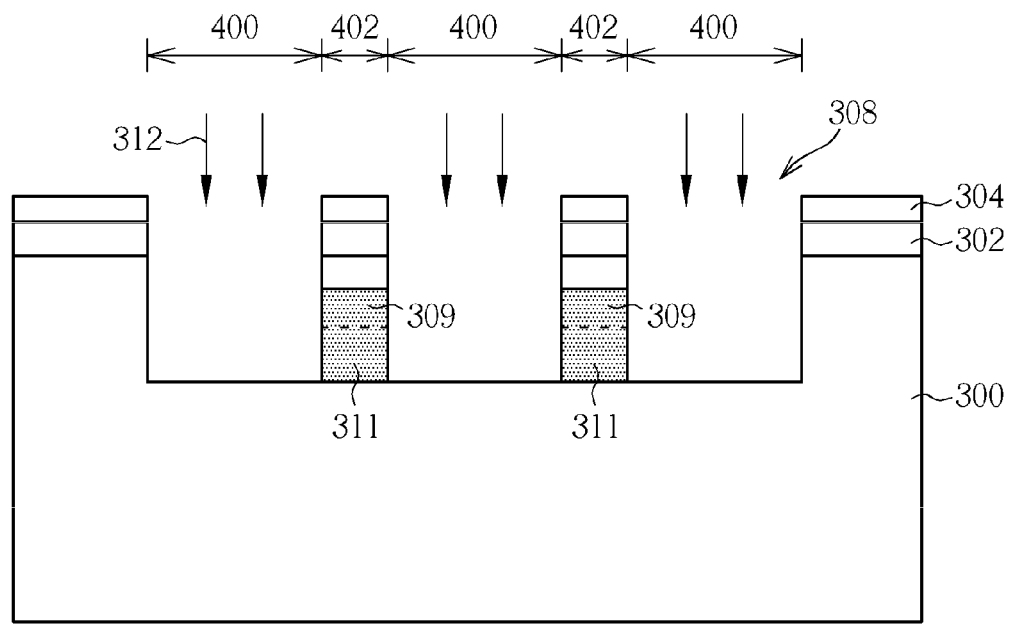

As shown in FIG. 5, a second etching process 312 is performed by still using the patterned pad layer 302 and the patterned mask layer 304 as a mask. In the second etching process, the first trenches 308 are deepened to a second predetermined depth substantially between 1000 and 2000 A. Meanwhile, a plurality of fin structures 311 are simultaneously formed in the substrate 300 in the fin regions 402. It is understood that each fin structure 311 includes the doping region 309.

Figure 6:
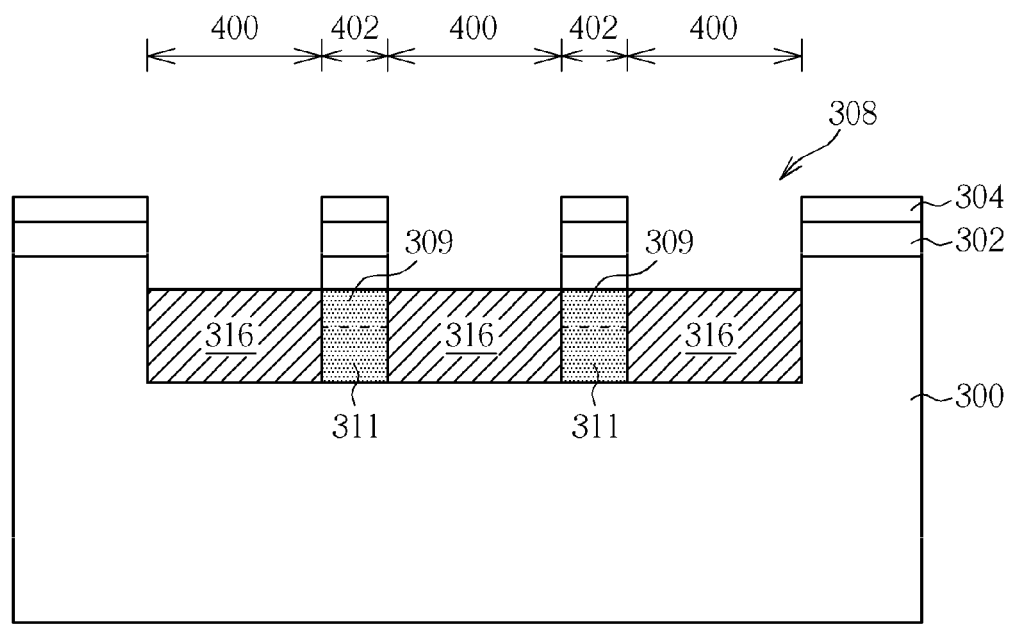
Figure 7:
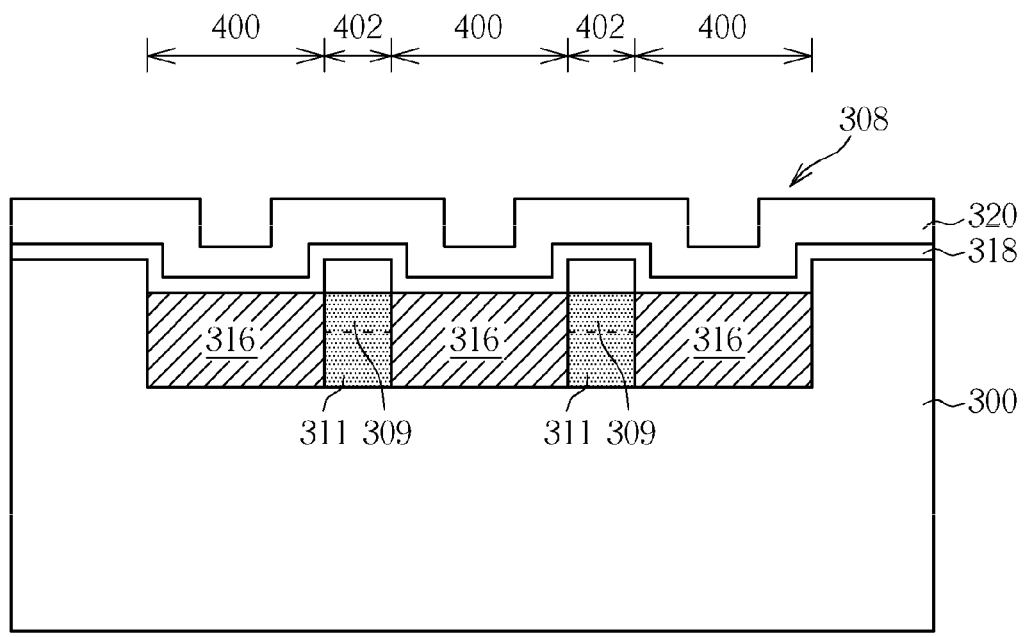

As shown in FIG. 6, a plurality of shallow trench isolations (STIs) 316 are formed in the first trenches 308. For example, an insulation layer is formed on the substrate 300 and an etching back process is performed to completely remove the insulation layer outside the isolation region 400 and partially remove the insulation layer in the isolation region 400 until a predetermined depth so a sidewall of the fin structure 311 can be exposed. In another embodiment, after deposition the insulation layer, a chemical mechanical polish (CMP) process can be performed and then an etching back process is performed to remove the insulation layer in the isolation region 400 until a predetermined depth so a sidewall of the fin structure 311 can be exposed As shown in FIG. 7, after removing the patterned pad layer 302 and the patterned mask layer 304, a dielectric layer 318 and a conductive layer 320 are formed on the substrate 300. The dielectric layer 318 can be $SiO_2$, SiN, SiON or high-k material, or combinations thereof formed by a CVD process or a thermal oxidation process. The high-k dielectric layer can be selected from a group consisting of, for example, hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The conductive layer 320 can include poly-silicon, metal, the combination of silicon and metal, or any material suitable for gate electrode such as silicon germanium. Preferably, the dielectric layer 318 and the conductive layer 320 are formed in the first trench 308 and directly on the top surface and the sidewall of the fin structure 311, thereby enlarging the length of the channel.

Figure 8:
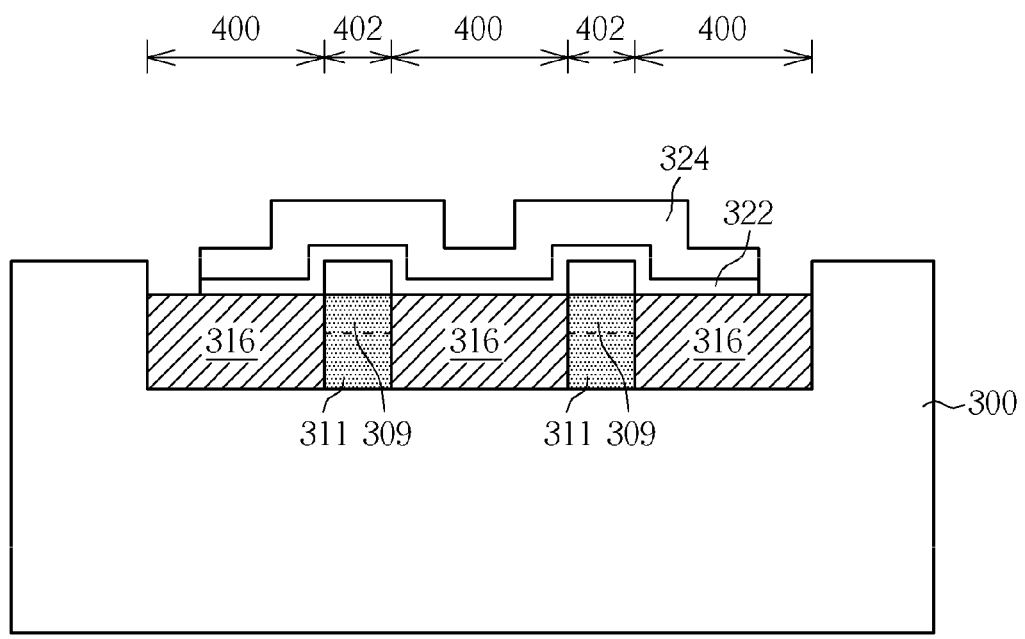
Figure 9:
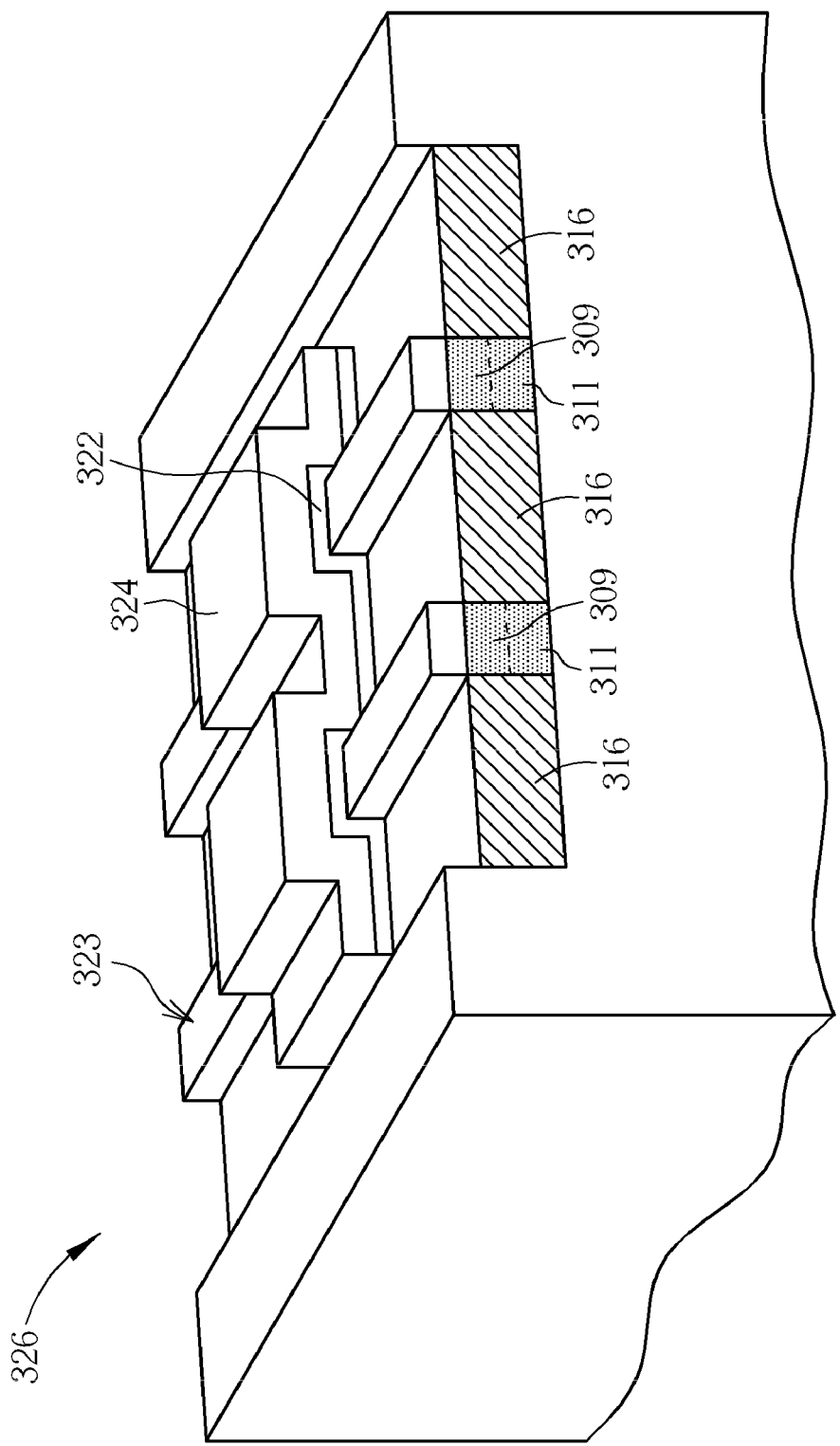

As shown in FIG. 8 and FIG. 9, the dielectric layer 318 and the conductive layer 320 are patterned to form a gate dielectric layer 322 and a gate 324 respectively. A source/drain region 323 above the doping region 309 can be formed in the fin structure 311 at two sides of the gate 324. A non-planar transistor 326 in the present invention is therefore completed. As shown in FIG. 8 and FIG. 9, the doping region 309 is disposed below the source/drain region 323 and can serve as an anti-punch-through doping region, so the leakage current of the non-planar transistor 326 can be reduced and thus the quality thereof can be improved.

It is noted that, after forming the structure in FIG. 8 and FIG. 9, other semiconductor processes can still be performed. For example, a light doping region (LDD) (not shown) can be formed in the fin structure 311 at two sides of the gate 324; an epitaxial layer (not shown) can be formed in the fin structure 311 at two sides of the gate 324; a spacer (not shown) can be formed on the sidewall of the gate 324; and a gate silicide layer (not shown) can be formed on the fin structure 311 at two sides of the gate 324. Furthermore, the aforementioned description takes the FIN-FET for example. However, in another embodiment, the fabrication method can be applied to other non-planar transistors. In still another embodiment, the fabrication method can also be applied to the poly-silicon gate process, the gate-first process or the gate-last process.

The gate of the non-planar transistor 326 can include poly-silicon, silicide or metal, depending on different fabricating processes.

Figure 10:
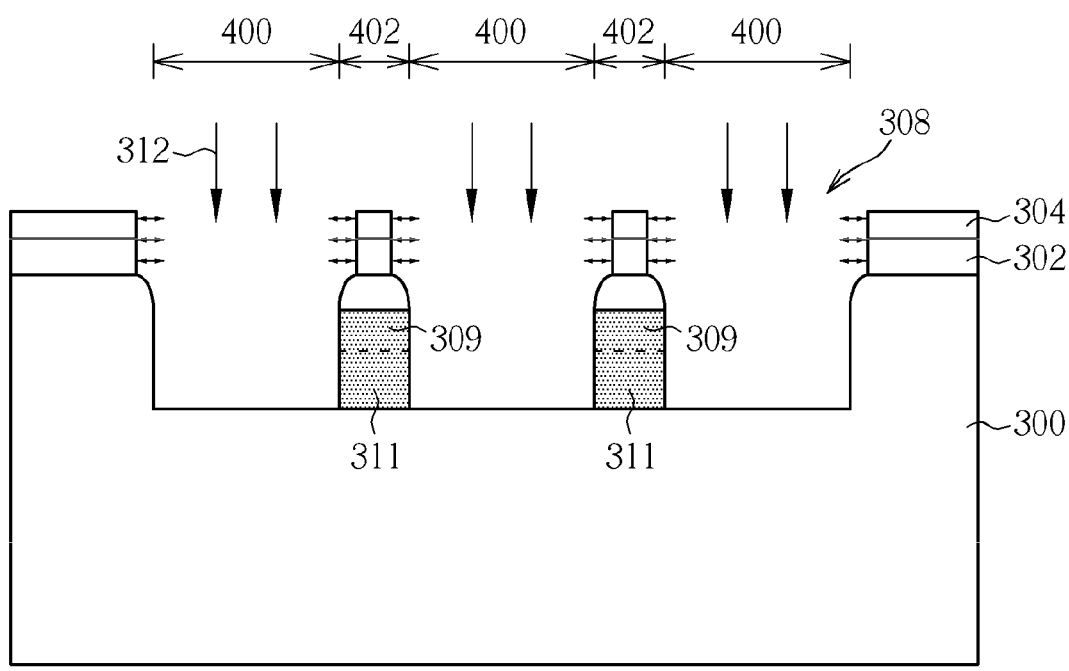
FIG. 10 illustrates a schematic diagram of the fabrication method of a non-planar FET according to the second embodiment in the present invention.

Please refer to FIG. 10, illustrating a schematic diagram of the fabrication method of a non-planar FET according to the second embodiment in the present invention. As shown in FIG. 10, before performing the second etching process, a trimming process can be performed toward the patterned pad layer 302 and the patterned mask layer 304 to reduce the areas thereof. Thus, when performing the second etching process 312 by using the lessened patterned pad layer 302 and the patterned mask layer 304 as a mask, the fin structure 311 forms a curved corner between the top surface and the sidewall. Consequently, an uneven electrical field in the corner of the fin structure 311 can be avoided. In another embodiment, the trimming process can be performed after the second etching process.

In summary, the present invention provides a fabrication method of a non-planar transistor, which can obtain a non-planar transistor having a fin structure with an anti-punch-through doping region. Since the bottom doping regions are formed directly in the silicon substrate in the isolation regions, the dopant in the bottom doping regions can diffuse into the fin regions more easily during the annealing process. The anti-punch-through doping regions can therefore be formed in the fin structures, reducing the leakage current of the non-planar transistors and thus enhancing the quality thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabrication method of a non-planar transistor, comprising:
   providing a substrate having a plurality of isolation regions to be formed and a plurality of fin regions to be formed, wherein each isolation region to be formed and each fin region to be formed are arranged alternatively;
   performing a first etching process to form a plurality of first trenches having a first depth in the substrate in the isolation regions;
   after performing the first etching process, forming at least a doping region in the substrate in the fin regions;
   after forming the doping region, performing a second etching process to deepen the first depth to a second depth and a plurality of fin structures are formed in the substrate in the fin regions;
   forming a plurality shallow-trench-isolations in the first trenches; and
   forming at least a gate on the fin structures and at least a source/drain region in the fin structures.

2. The fabrication method of a non-planar transistor according to claim 1, wherein the step of forming the doping region comprises:
   performing a vertical implanting process; and
   performing an annealing process.

3. The fabrication method of a non-planar transistor according to claim 2, wherein in the vertical implanting process, a plurality of bottom doping regions are formed on the bottom surface of the first trenches.

4. The fabrication method of a non-planar transistor according to claim 2, wherein in the vertical implanting process, the substrate in the isolation regions is exposed.

5. The fabrication method of a non-planar transistor according to claim 4, wherein the exposed substrate comprises silicon.

6. The fabrication method of a non-planar transistor according to claim 1, further comprising forming a patterned mask layer.

7. The fabrication method of a non-planar transistor according to claim 6, the first etching process and the second etching process are performed by using the patterned mask layer as a mask.

8. The fabrication method of a non-planar transistor according to claim 6, further comprising forming a patterned pad layer between the substrate and the patterned mask layer.

9. The fabrication method of a non-planar transistor according to claim 6, further comprising performing a trimming process toward the patterned mask layer.

10. The fabrication method of a non-planar transistor according to claim 1, wherein the fin structures comprise curved corners.

* * * * *